United States Patent
Seok et al.

(10) Patent No.: US 7,887,780 B2
(45) Date of Patent: Feb. 15, 2011

(54) ANATASE TYPE TIO2 NANORODS AND THEIR PREPARATION METHOD

(75) Inventors: Sang Il Seok, Daejeon (KR); In Chan Baek, Gyeongsangnam-do (KR); Jeong Ah Chang, Daejeon (KR)

(73) Assignee: Korea Research Institute of Chemical Technology (KR)

( * ) Notice: Subject to any disclaimer, the term of this patent is extended or adjusted under 35 U.S.C. 154(b) by 71 days.

(21) Appl. No.: 12/471,854

(22) Filed: May 26, 2009

(65) Prior Publication Data
US 2009/0291044 A1 Nov. 26, 2009

(30) Foreign Application Priority Data
May 26, 2008 (KR) .................. 10-2008-0048502

(51) Int. Cl.
*C01G 23/047* (2006.01)
*H01L 31/00* (2006.01)

(52) U.S. Cl. .................. 423/612; 423/610; 977/762; 136/252

(58) Field of Classification Search ......... 423/610–616; 977/762, 773, 811
See application file for complete search history.

(56) References Cited

U.S. PATENT DOCUMENTS

| | | | |
|---|---|---|---|
| 6,440,383 B1 | 8/2002 | Duyvesteyn et al. | |
| 6,537,517 B1 * | 3/2003 | Kasuga et al. | 423/610 |
| 7,431,903 B2 * | 10/2008 | Koyanagi et al. | 423/81 |
| 7,645,439 B2 * | 1/2010 | Toledo Antonio et al. | 423/609 |
| 7,687,431 B2 * | 3/2010 | Nakayama et al. | 502/355 |
| 7,799,313 B2 * | 9/2010 | Toledo Antonio et al. | 423/609 |
| 2009/0084434 A1 * | 4/2009 | Park et al. | 136/252 |
| 2010/0006134 A1 * | 1/2010 | Nakayama et al. | 136/244 |
| 2010/0139747 A1 * | 6/2010 | Feng et al. | 136/255 |

FOREIGN PATENT DOCUMENTS

KR 10-2000-0066290 11/2000

OTHER PUBLICATIONS

S. T. Aruna et al., "Nanosize rutile titania particle synthesis via a hydrothermal method without mineralizers", J. Mater. Chem., 2000, 10, pp. 2388-2391.

(Continued)

*Primary Examiner* — Stanley Silverman
*Assistant Examiner* — Anthony J Zimmer
(74) *Attorney, Agent, or Firm* — Cantor Colburn LLP

(57) ABSTRACT

Provided is a process which includes slowly adding dropwise chilled distilled water to titanium tetrachloride to prepare solution of titanium oxychloride; adding basic solution thereto to maintain pH of the titanium oxychloride solution within a range from 3.5 to 4, thereby providing a suspension of titanium oxyhydroxide precipitate; adding basic solution thereto to adjust the suspension of titanium oxyhydroxide precipitate to be weakly basic, and heating and stirring the mixture at 80 to 100° C.; isolating and collecting dihydroxy-oxotitanium from the heated and stirred suspension of titanium oxyhydroxide precipitate, and washing it with weakly basic aqueous solution; and adding distilled water and 20 to 500 folds of hydrogen peroxide on the basis of 1 mole of $Ti^{4+}$ in titanium oxyhydroxide to the washed titanium oxyhydroxide, and heat-treating the mixture at a temperature of 90 to 100° C. for 1 to 7 days to prepare titania nanorods having the mean length of 100 nm to 300 nm.

8 Claims, 1 Drawing Sheet

OTHER PUBLICATIONS

Yuanzhi Li et al., "A novel method for preparation of nanocrystalline rutile TiO2 powders by liquid hydrolysis of TiCl4", J. Mater. Chem., 2002, 12, pp. 1387-1390.

Revathi R. Bacsa et al., "Rutile Formation in Hydrothermally Crystallized Nanosized Titania", J. Am. Ceram. Soc. 79 [8] pp. 2185-2188, 1996.

Chen-Chen Wang et al., "Sol-Gel Synthesis and Hydrothermal Processing of Anatase and Rutile Titania Nanocrystals", Chem. Mater. 1999, 11, pp. 3113-3120.

Sun-Jae Kim et al., "Homogeneous Precipitation of TiO2 Ultrafine Powders from Aqueous TiOCl2 Solution", J. Am. Ceram. Soc. 82 [4] pp. 927-932, 1999.

Wei Wang et al., "Synthesis of Rutile ($\alpha$-TiO2) Nanocrystals with Controlled Size and Shape by Low-Temperature Hydrolysis: Effects of Solvent Composition", The Journal of Physical Chemistry B., vol. 108, No. 39, Sep. 30, 2004, pp. 14789-14792.

Abdelkrim Chemseddine et al., "Nanostructuring Titania: Control over Nanocrystal Structure, Size, Shape, and Organization", Eur. J. Inorg. Chem., 1999, pp. 235-245.

P. Davide Cozzoli et al., "Low-Temperature Synthesis of Soluble and Processable Organic-Capped Anatase TiO2 Nanorods", J. Am. Chem. Soc. 2003, 125, pp. 14539-14548.

* cited by examiner

[Fig. 1]
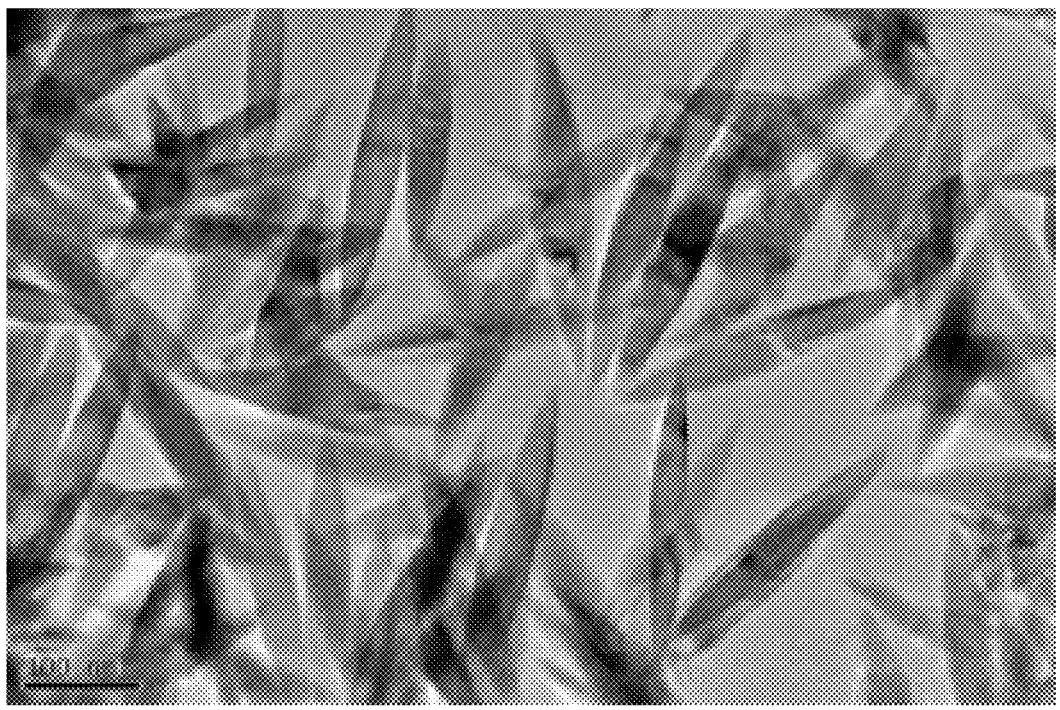
[Fig. 2]
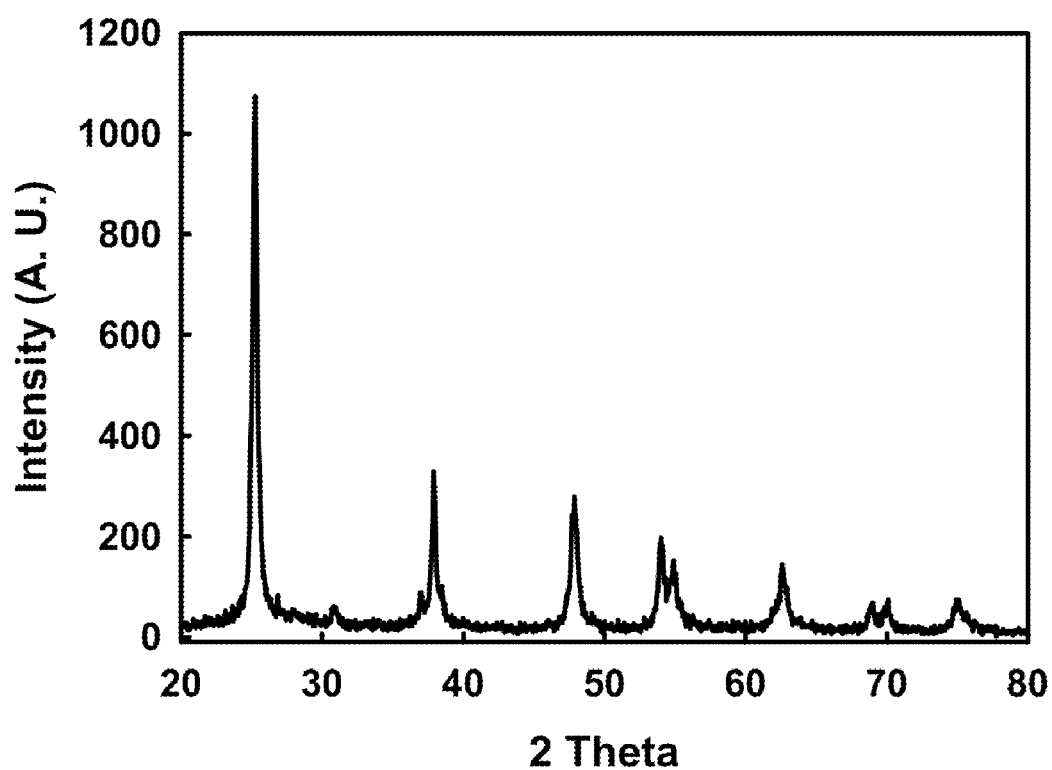

ANATASE TYPE TIO2 NANORODS AND THEIR PREPARATION METHOD

BACKGROUND OF THE INVENTION

1. Field of the Invention

The present invention relates to a process for preparing titania nanorods for dye or quantum dot-sensitized solar cells; and, more particularly, to a process for preparing anatase type titania nanorods having the mean length of 100 nm to 300 nm by preparing aqueous titanium oxychloride (TiOCl$_2$) solution by the use of titanium tetrachloride (TiCl$_4$); preparing titanium oxyhydroxide [TiO(OH)$_2$] precipitate with controlled particle size and shape via pH adjustment, control of reaction rate and heat-treatment; and adding hydrogen peroxide and water to titanium oxyhydroxide thus prepared and heating the mixture.

2. Description of Related Art

Titania (TiO$_2$) is physically and chemically stable, having more than 2.5 of refractive index, which is higher than that of diamond (having the highest refractive index among natural materials). Higher refractive index increases the amount of light exited from the medium having lower refractive index in optical material, and decreases size of the core or thickness of the optical lense in an optical waveguide-type device. When particles of high refractive index are dispersed in polymeric medium, whiteness is improved due to their excellent ability of light scattering.

Titania, due to its high refractive property, is one of the most important industrial materials which have long been utilized as white pigment. Further, titania having high dielectric constant has been significantly considered as raw material for piezo electrics, dielectrics and semiconductor material, as electronic industry develops. Recently, use of titania rapidly extends to the applications in the field of cosmetics, thin layers, packing materials, paint, lubricant and fine ceramics as catalyst for removing organic contaminants, due to its chemical anti-corrosion property and photo-catalytic effect. Furthermore, extensive studies have been carried out for developing dye-sensitized solar cells utilizing titania as optical electrode and dye as solar photo-absorber, since they have much benefit in terms of cost in relation to efficiency.

A solar cell described herein means a cell wherein current-voltage is generated by using photovoltaic effect, generating electrons and holes by light absorbed by semiconductor. Initially, n-p diodes of inorganic semiconductors such as silicon and gallium arsenide (GaAs) have been employed as the semiconductor of solar cells. But the production cost was so high, thereby giving hindrance against vast use of solar cells.

In order to solve the problem, interests are concentrated on dye (or quantum-dot nanoparticle)-sensitized solar cells using cheap titania as the main constituent. A conventional dye-sensitized solar cell has a laminated structure consisting of a transparent substrate, a titania layer as photoanode, a photo-sensitized dye layer, an electrolyte layer, an electrode layer and a count electrode. The titania layer has porous structure in order to facilitate coloration of dye, and provides a pathway for electrons generated by reactions of electron- and hole-isolation.

Thus, titania should have high specific surface area and excellent ability for electron transfer itself, in order to prepare a dye-(or quantum nanoparticle) sensitized solar cell of high efficiency. Though essentially required is a technique for preparing nano-sized titania particles to obtain high specific surface area of titania, the problem to be most urgently solved for dye-(or quantum-dot nanoparticle)-sensitized solar cells of high efficiency at present is a technique to enhance the electron-transfer properties of titania. The electron-transfer properties of titania depend on shape of the particle, crystal structure, proportion of grain boundary, defects on the crystal structure, surface defects, or the like; being much affected by the process for preparing titania nanoparticles.

A variety of processes have been known for preparing titania to be used for dye-(or quantum-dot nanoparticle) sensitized solar cells or other use. However, conventional techniques for preparing titania via hydrolysis and condensation at ambient pressure and heat-treatment by using titanium tetrachloride or titanium oxychloride as starting material [Korean Patent Application No. 2000-0066290; U.S. Pat. No. 6,440,383; Bsaca et al., J. Am. Ceram. Soc., 79, 2185, 1996; C-C. Wang et al., Chem. Mater., 11, 3113, 1999; S. T. Aruna et al., J. Mater. Chem., 10, 2388, 2000; Y. Li et al., J. Mater. Chem., 12, 1387, 2002; J. Sun et al., J. Am. Ceram. Soc., 82, 927, 1999; W. Wang et al., J. Phys. Chem. B. 108, 14789, 2004] simply provide ball-shaped or rice-shaped titania with low aspect ratio. Certain processes for preparing rod-type titania having long major-axis (advantageously used for a dye-(or quantum-dot nanoparticle)-sensitized solar cell) have been reported by literature [A. Chemseddine et al, Eur. J. Inorg. Chem., 1999, 235, 1999; P. Davide CozzoliA et al, J. Am. Chem. Soc., 125, 14539, 2003]. However, in the processes, a large amount of surfactant (such as tetramethylammonium hydrocide and oleic acid) is used as growing agent for certain direction, so that washing or additional heat-treatment is required after preparing the rod-type titania.

SUMMARY OF THE INVENTION

An object of the invention is to provide a process for preparing, without using surfactant or polymeric template, titania nanorods having a shape of long rods in one direction to facilitate electron transfer, to which a large amount of dye (or quantum-dot nanoparticles) can be easily deposited due to high specific surface area.

A process for preparing titania nanorods for dye-(or quantum nanoparticle) sensitized solar cells comprises (a) slowly adding dropwise chilled distilled water to titanium tetrachloride (TiCl$_4$) to prepare solution of titanium oxychloride (TiOCl$_2$); (b) adding basic solution thereto to maintain pH of the titanium oxychloride) solution within a range from 3.5 to 4, thereby providing a suspension of titanium oxyhydroxide (TiO(OH)$_2$) precipitate; (c) adding basic solution thereto to adjust the suspension of titanium oxyhydroxide precipitate to be weakly basic, and heating and stirring the mixture at 80 to 100° C.; (d) isolating and collecting titanium oxyhydroxide from the heated and stirred suspension of dihydroxy-oxotitanium precipitate, and washing it with weakly basic aqueous solution; and (e) adding distilled water and 20 to 500 folds of hydrogen peroxide (H$_2$O$_2$) on the basis of 1 mole of Ti$^{4+}$ in titanium oxyhydroxide to the washed titanium oxyhydroxide, and heat-treating the mixture at a temperature of 90 to 100° C. for 1 to 7 days to prepare titania nanorods having the mean length of 100 nm to 300 nm.

BRIEF DESCRIPTION OF THE DRAWINGS

FIG. 1 shows the image of titania nanorods prepared in accordance with Example 1 of the present invention observed by means of transmission electron microscope (TEM).

FIG. 2 illustrates the X-ray diffraction results of titania nanorods prepared in accordance with Example 1 of the present invention.

DESCRIPTION OF SPECIFIC EMBODIMENTS

The advantages, features and aspects of the invention will become apparent from the following description of the embodiments with reference to the accompanying drawings, which is set forth hereinafter.

The process in accordance with the invention is to prepare titania nanoparticles having rod shape with the mean length of major axis of 100 nm to 300 nm. In order to control the shape, a large excess amount (from 20 to 500 folds) than what is required for dissolving titanium oxyhydroxide precipitate of hydrogen peroxide ($H_2O_2$) is added, and the mixture was heat-treated under certain condition to provide particles with large aspect ratio along one direction. Thereby, obtained are titania nanorods to achieve high efficiency of dye-(or quantum-dot nanoparticle) sensitive solar cells due to effective transfer of photoelectric current generated by the dye (or quantum-dot nanoparticles).

More specifically, it is important to prepare very fine precipitate particles via homogeneous precipitation process in order to obtain titania nanorods having high aspect ratio to achieve excellent transfer of photoelectric current. For the purpose of obtaining homogenous and fine titanium oxyhydroxide particles (precipitate particles), (a) titanium oxychloride solution is prepared by using undiluted titanium tetrachloride solution to lower the activity toward hydrolysis reaction; (b) titanium oxyhydroxide precipitate with a controlled shape is prepared by the use of the titanium oxychloride solution obtained as above; and (c) the slurry-type precipitate is made weakly basic and firstly heat-treated at 80 to 100° C. Stage (c) is essential to provide higher aspect ratio for preparation of amorphous titania hydrate required for titania nanorods in accordance with the process of the present invention. If stage (c) is omitted, the length/diameter ratio decreases.

Then, (d) residual ions ($Cl^-$ ions) existing in the isolated and collected titanium oxyhydroxide precipitate after the reaction are removed by washing with ion exchanging water. In stage (e), distilled water and a large amount of hydrogen peroxide are added to the washed titanium oxyhydroxide. The amount of hydrogen peroxide added is from 20 to 500 folds on the basis of 1 mole of $Ti^{4+}$ in titanium oxyhydroxide, to result in titania nanorods having the aspect ratio (length/diameter) of at least 10. If the amount of hydrogen peroxide is less than 20 folds, ball or rice-grain shaped nanoparticles with aspect ratio of less than 2 are obtained, while if the amount is more than 500 folds, no more increase in aspect ratio occurs.

Thereafter, the suspension is heat-treated at a temperature of 90 to 100° C. for 1 to 7 days to give titania nanorods of genuine anatase structure, having excellent property to transfer photoelectric current, with the mean length of 100 to 300 nm.

More specifically, in stage (a), cold (100° C. or lower) ion exchanged water is slowly added dropwise to undiluted titanium tetrachloride solution while maintaining it at 0° C. or lower, and the mixture is stirred to prepare transparent and yellow solution of titanyl chloride.

The titanium oxychloride solution of stage (a) can be prepared as a solution having the final molar concentration of $Ti^{4+}$ of 2 to 4 M in order to maintain stable at ambient temperature for one year or more, and used as stock solution. When prepared as stock solution, it is preferable to carry out a stage to adjust the molar concentration of $Ti^{4+}$ of the titanium oxychloride solution to 0.3~0.8 M by adding ion exchanged water. The purpose of dilution of titanium oxychloride solution to 0.3 to 0.8 M is to provide the concentration of titanium oxyhydroxide to be prepared by adding basic solution, being sufficient to be stirred.

Specifically, in stage (b), the titanium oxychloride solution is slowly added dropwise to the reaction vessel, and basic solution is added thereto at the same time; and pH of the titanium oxychloride solution charged to the reaction vessel is maintained within a range from 3.5 to 4 to provide titanium oxyhydroxide ($TiO(OH)_2$) precipitate. The rate of adding the titanium oxychloride solution dropwise to the reaction vessel preferably is 0.5 to 2 drop/sec, and the basic solution added to control pH preferably is ammonia solution ($NH_4OH$). In order to provide stabilization of the precipitate, further stirring for about 10 minutes is required. Under the conditions described above, titanium oxyhydroxide having regular size and controlled shape can be prepared.

Specifically, stage (c) is carried out by adding basic solution to the titanium oxyhydroxide precipitate obtained from (b) to make the suspension of the precipitate weakly basic, and heating with stirring the mixture at 80 to 100° C. for 2 to 4 hours. The condition of weakly basic in stage (c) preferably is pH 8 to 10, and the basic solution added to adjust pH preferably is ammonia solution ($NH_4OH$). Heat-treating titanium oxyhydroxide under weakly basic condition at 80 to 100° C. results in additional condensation of titanium oxyhydroxide; and this causes nucleation of amorphous titania to provide, during subsequent heat-treatment under the state of being dissolved in hydrogen peroxide, titania nanorods with anatase structure.

Specifically, stage (d) is carried out by re-dispersing in ion exchanged water titanium oxyhydroxide isolated and collected from the suspension of the precipitate by means of a conventional filtering device or a centrifuge titanium oxyhydroxide as a cake, including titanium oxyhydroxide isolated and dried), and adding aqueous ammonia dropwise to make pH of the solution weakly basic to facilitate washing and filtering [re-isolation and recovery of titanium oxyhydroxide. Washing of stage (d) is preferably repeated 2~4 times in order to remove residual impurity ions after the reaction, and pH of the weakly basic aqueous solution preferably is 8 to 10.

Specifically, in stage (e), 100 to 400 folds of distilled water and 20 to 500 folds of hydrogen oxide on the basis of 1 mole of $Ti^{4+}$ in titanium oxyhydroxide washed with ion exchanged water as above is added thereto, and the mixture is stirred to give orange suspension, and then heat-treated at 90 to 100° C. for 1 to 7 days. More specifically, it is preferable that 100 to 400 folds of distilled water on the basis of 1 mole of $Ti^{4+}$ in titanium oxyhydroxide washed as above is added, and the mixture stirred for about 10 minutes; and 20 to 500 folds of hydrogen peroxide is then added thereto and the resultant mixture is stirred again for about 20 to 40 minutes until the initially deep yellow suspension becomes more transparent orange color; and the suspension is heat-treated at 90 to 100° C. for 1 to 7 days.

If the temperature of heat-treatment in stage (e) is less than 90° C., longer duration for heat-treatment is required. Temperature higher than 100° C. is unfavorable due to boiling of water. After performing the reaction at the heat-treating temperature for at least 1 day, rod-type titania particles begin to occur; reaction up to 3 days provides rod-type titania particles uniformly dispersed in the suspension; and reaction of at least three days provides precipitate of rod-type titania particles prepared. If the reaction is continued 7 days or more, change of size or shape of titania particles hardly occurs. Thus the duration of heat-treatment in stage (e) preferably is from 1 to 7 days, more preferably from 1 to 3 days.

The titania nanorods prepared in accordance with the process of the present invention are characterized by mean length of 100 to 300 nm, aspect ratio of 10 to 30, and genuine anatase structure. Further, the titania nanorods thus prepared have less intergranular defection as compared to those achieved by connection of ball-type particles, thereby being expected to have excellent property of transferring photoelectric current generated by dye or quantum-dot nanoparticles.

Example 1

Preparation of Titanium Oxychloride ($TiOCl_2$) Solution

Undiluted $TiCl_4$ solution (from Aldrich Chemical Co., Inc., Milwaukee, Wis.) was maintained at a temperature of 0° C. or lower. Chilled (5° C.) ion exchanged water was slowly added dropwise thereto to obtain 3 M of $Ti^{4+}$ ion concentration. When the reaction was completed, obtained was clear yellow $TiOCl_2$ solution, which could be kept stable at ambient temperature for at least one year (stock solution). Water was added to the stock solution in order to adjust the concentration to make final concentration of 0.5 M $Ti^{4+}$ ion (200 mL).

Preparation of Titanium Oxyhydroxide ($TiO(OH)_2$) Precipitate

The clear solution of 0.5 M $Ti^{4+}$ ion concentration was added to the reaction vessel at a rate of about 1 drop/sec by means of peristaltic pump (WON Corp., BS-60101, Korea). Undiluted ammonia solution used to obtain the precipitate (Samchun Pure Chemical Co., Ltd. Korea) was added to make pH of the liquid in the reaction vessel within a range from 3.5~4.0. When the reaction was completed, the reaction mixture was further stirred for about 10 minutes to stabilize the precipitate.

Adjustment of pH and Heat-Treatment of Titanium Oxyhydroxide ($TiO(OH)_2$) Precipitate To titanium oxyhydroxide precipitate thus prepared, added was ammonia solution to adjust the pH 9.0. Then, the mixture was transferred to a 2000 mL reaction vessel, and stirred at 90° C. for 3 hours to carry out heat-treatment.

Isolating and Washing of Titanium Oxyhydroxide ($TiO(OH)_2$)

After heat-treatment was completed, the suspension titanium oxyhydroxide ($TiO(OH)_2$) precipitate was filtered to isolate titanium oxyhydroxide precipitate. In order to remove $Cl^-$ ion in the solution (existing in the form of ammonium chloride) of the collected titanium oxyhydroxide, 200 mL of distilled water was added, and pH was adjusted to 9.0 by using aqueous ammonia, and the mixture was stirred (This process was repeated three times).

Preparation of Titania Nanorods

The precipitate (5.28 g) obtained from washing with ion exchanged water and filtration was charged to a 500 mL round-bottomed flask containing a magnetic stirrer, and distilled water (100 mL) was added thereto. After stirring the mixture for about 10 minutes, 90 mL of $H_2O_2$ solution (Junsei Chemical Co., Ltd., Japan) was added thereto. When $H_2O_2$ solution was added, the mixture initially became deep yellow suspension, but after 30 minutes, it became orange with increased clarity. In order to stabilize the exothermic reaction due to addition of $H_2O_2$ solution, the reaction mixture was stirred for 3 hours, and the reaction vessel was immersed in an oil bath controlled at 100° C. (the reaction temperature). A condenser was connected to the vessel, and the revolution rate was set at 1000 rpm. After 1 day of reaction at 100° C., rod type particles began to occur. After 3 days, slow settling of particles could be confirmed. Though the reaction duration was prolonged up to 7 days, no more change in shape or size of the particles was observed.

FIG. 1 is photograph of titania nanorods prepared by 3-day reaction (maximum reaction duration without settling of particles), from transmission electron microscope (TEM, Tecnai, GII, FEI operating at 200 kV). FIG. 2 shows the analytical results from X-ray diffraction (Rigaku D/Max-2200V with CuK α radiation) of the titania nanoparticles prepared by 3-day reaction as for FIG. 1.

As can be seen from FIG. 1, titania nanorods having very long dimension of major axis are produced, with aspect ratio of at least about 10. From the results of electron diffraction pattern of TEM and X-ray diffraction shown in FIG. 2, production of anatase-type titania rods is confirmed.

The process according to the present invention provides titania nanoparticles of anatase structure having rod-shape with longer dimension in one direction, by using pure hydrogen peroxide without adding surfactant, templates or the like. The titania nanorods thus prepared have less intergranular defection as compared to photo-electrodes achieved by connection of ball-type particles, thereby being expected to have excellent property of transferring photoelectric current generated by dye or quantum-dot nanoparticles.

While the present invention has been described with respect to the specific embodiments, it will be apparent to those skilled in the art that various changes and modifications may be made without departing from the spirit and scope of the invention as defined in the following claims.

Thus, the idea of the invention should not be construed to be restricted to the Examples, but any equivalency or equivalent modifications of claims, as well as claims themselves described here-in-below are intended to fall under the scope of the idea of the invention.

What is claimed is:

1. A process for preparing titania nanorods for dye sensitized or quantum-dot nanoparticle sensitized solar cells, comprising:
   (a) slowly adding dropwise chilled distilled water to titanium tetrachloride ($TiCl_4$) to prepare a solution of titanium oxychloride ($TiOCl_2$);
   (b) adding basic solution the solution of titanium oxychloride to maintain pH of the titanium oxychloride solution within a range from 3.5 to 4, thereby providing a suspension of titanium oxyhydroxide ($TiO(OH)_2$) precipitate;
   (c) adding basic solution the suspension of titanium oxyhydroxide precipitate to adjust the suspension of titanium oxyhydroxide precipitate to be weakly basic, and heating and stirring the mixture at 80 to 100° C.;
   (d) isolating and collecting titanium oxyhydroxide from the heated and stirred suspension of titanium oxyhydroxide precipitate, and washing the collected titanium oxyhydroxide with a weakly basic aqueous solution; and
   (e) adding distilled water and 20 to 500 fold of hydrogen peroxide ($H_2O_2$) on the basis of 1 mole of $Ti^{4+}$ in the titanium oxyhydroxide to the washed titanium oxyhydroxide to form a mixture, and heat-treating the mixture at a temperature of 90 to 100° C. for 1 to 7 days to prepare titania nanorods having a mean length of 100 nm to 300 nm.

2. The process of claim 1, wherein the molar concentration of the $Ti^{4+}$ ion of the titanium oxychloride solution in (a) is from 2 to 3 M, the process further comprising adjusting the $Ti^{4+}$ ion concentration of the titanium oxychloride solution to 0.3 to 0.8 M by adding distilled water after step (a).

3. The process of claim 2, wherein the weakly basic suspension of titanium oxyhydroxide precipitate of (c) has pH of 8 to 10.

4. The process of claim 1, wherein the weakly basic aqueous solution of (d) is aqueous ammonia solution ($NH_4OH$) of pH 8 to 10, and the washing is repeated 2~4 times.

5. The process of claim 1, wherein the basic solution of (b) and (c) is ammonia solution ($NH_4OH$).

6. The process of claim 2, wherein stage (e) is characterized in that distilled water is added in an amount of 100 to 400 fold on the basis of $Ti^{4+}$ molar concentration of the washed titanium oxyhydroxide, and the mixture is stirred, and then 20 to 500 fold of hydrogen peroxide is added to the mixture, and the resultant mixture is stirred again and heat-treated at a temperature of 90 to 100° C. for 1 to 7 days.

7. The process of claim 2, wherein the aspect ratio of titania nanorods from (e) is from 10 to 30.

8. The process of claim 2, wherein the titania nanorods from (e) have anatase structure.

* * * * *